United States Patent
Huang et al.

(10) Patent No.: US 8,307,881 B2
(45) Date of Patent: Nov. 13, 2012

(54) CASTING MOLDS FOR USE IN DIRECTIONAL SOLIDIFICATION PROCESSES AND METHODS OF MAKING

(75) Inventors: Shyh-Chin Huang, Latham, NY (US); Andrew John Elliott, Westminster, SC (US); Michael Francis Xavier Gigliotti, Jr., Scotia, NY (US); Roger John Petterson, Fultonville, NY (US); Stephen Francis Rutkowski, Duanesburg, NY (US)

(73) Assignee: General Electric Company, Niskayuna, NY (US)

( * ) Notice: Subject to any disclaimer, the term of this patent is extended or adjusted under 35 U.S.C. 154(b) by 478 days.

(21) Appl. No.: 12/348,937

(22) Filed: Jan. 6, 2009

(65) Prior Publication Data
US 2010/0170654 A1 Jul. 8, 2010

(51) Int. Cl.
*B22D 27/04* (2006.01)
*B22C 9/00* (2006.01)
*B22C 1/02* (2006.01)

(52) U.S. Cl. ............ 164/122.1; 164/361; 164/519

(58) Field of Classification Search ............ 164/122.1, 164/122.2, 338.1, 361, 519
See application file for complete search history.

(56) References Cited

U.S. PATENT DOCUMENTS

| | | | |
|---|---|---|---|
| 4,664,172 A | 5/1987 | Takayanagi | |
| 4,966,225 A * | 10/1990 | Johnson et al. | 164/519 |
| 5,275,227 A | 1/1994 | Staub | |
| 6,276,433 B1 | 8/2001 | Gigliotti, Jr. et al. | |
| 6,308,767 B1 * | 10/2001 | Hugo et al. | 164/122.1 |
| 6,676,381 B2 | 1/2004 | Subramanian et al. | |
| 7,296,616 B2 * | 11/2007 | Bewlay et al. | 164/519 |
| 2003/0124395 A1 * | 7/2003 | Whittle et al. | 428/702 |
| 2005/0252634 A1 * | 11/2005 | Biramben et al. | 164/519 |
| 2006/0130996 A1 | 6/2006 | Bewlay et al. | |

FOREIGN PATENT DOCUMENTS
EP  1595620  11/2005

OTHER PUBLICATIONS
EP09180169 Search Report, Apr. 16, 2010.
* cited by examiner

*Primary Examiner* — Kevin P Kerns
(74) *Attorney, Agent, or Firm* — Ann M. Agosti

(57) ABSTRACT

Casting molds suitable for directional solidification processes using a liquid cooling bath include a graded facecoat structure on a mold body. The graded facecoat structure includes an innermost layer and a delamination layer, wherein the delamination layer fractures upon cooling of the molten metal so as to separate the mold body from the innermost layer, which remains in contact with or in close proximity to the metal being cast. Also disclosed are directional solidification processes.

20 Claims, 2 Drawing Sheets

CASTING MOLDS FOR USE IN DIRECTIONAL SOLIDIFICATION PROCESSES AND METHODS OF MAKING

BACKGROUND OF THE INVENTION

The present disclosure generally relates to casting molds for use in directional solidification casting processes and methods of making the same. More particularly, the casting mold includes a graded facecoat structure that is configured to prevent or delay a liquid metal cooling agent from reacting with a surface of the casting metal during the directional solidification process.

Directional solidification processes are methods commonly employed for producing parts such as turbine blades and vanes with columnar and single crystal growth structures. It is well known that the high temperature mechanical properties of single crystal superalloys are superior to castings with polycrystalline structures. Generally, a desired single crystal growth structure is created at the base of a vertically disposed mold defining a part. Then, a single crystal solidification front is propagated through the structure under the influence of a moving thermal gradient.

Various processes exist for directional solidification. In one process, directional solidification can be achieved by slowly lowering a mold containing molten metal out of a heated furnace and into a liquid cooling bath, which acts as a cooling medium for the molten material. The cooling bath can include a metal that is heated to a temperature below the melting point of the molten material and above the melting point of the liquid cooling agent. Solidification of the molten material can progress from the bottom to the top of the mold as the mold is lowered into the cooling bath. In this manner, a solid-liquid interface can advance upward as heat is transferred from the molten material within the mold to the liquid cooling bath. One of the problems of liquid cooling the mold is the propensity that the liquid cooling agent contaminates the casting material, resulting in undesirable surface pitting. Reaction of the liquid cooling agent with the casting metal can occur if the mold is not properly sealed or if it cracks prematurely before completion of a casting run.

Facecoats are sometimes used to form a protective barrier between the molten casting metal and the surface of the shell mold. For example, U.S. Pat. No. 6,676,381 (Subramanian et al.) describes a facecoat based on yttria or at least one rare earth metal and other inorganic components, such as oxides, silicides, silicates, and sulfides. The facecoat compositions are most often in the form of slurries, which generally include a binder material along with a refractory material such as the yttria component. When a molten reactive casting metal is delivered into the shell mold, the facecoat prevents the undesirable reaction between the casting metal and the walls of the mold, i.e., the walls underneath the facecoat. Facecoats can sometimes be used, for the same purpose, to protect the portion of a core (within the shell mold), which would normally come into contact with the casting metal. Current facecoats are prone to failure such as when the mold body cracks during the casting process.

Accordingly, it would be desirable to have a casting mold suitable for directional solidification processes that employ a liquid cooling bath, wherein the mold is configured to prevent or delay a liquid metal cooling agent from reacting with a surface of the casting metal during the directional solidification process.

BRIEF SUMMARY

Disclosed herein are molds for a directional solidification process and processes thereof. In one embodiment, the mold for a directional solidification process comprises a graded facecoat structure comprising an innermost layer for contacting molten metal during the directional solidification process and a delamination layer in contact with a mold body, wherein the delamination layer is configured to fracture upon directional solidification of the casting metal.

In another embodiment, the mold comprises a graded facecoat structure comprising a innermost layer, a sintered layer, and a delamination layer comprising pores; and a mold body, wherein the innermost layer and the sintered layer are configured to adhere or remain in close proximity to the casting metal upon cooling and directional solidification of the casting metal, and wherein the mold body separates from the innermost layer and the sintered layer at about the delamination layer.

A directional solidification casting process comprises casting a molten metal in a mold, wherein the mold comprises a graded facecoat structure formed on a mold body, the graded facecoat structure comprising an innermost layer for contacting the molten metal and a delamination layer; lowering the mold into a liquid cooling bath comprising a liquid cooling agent heated to a temperature below the melting point of the molten material and above the melting point of the liquid cooling agent; and transferring heat from the mold to the liquid cooling bath and directionally solidifying the molten metal as it is lowered into the liquid cooling bath; wherein the delamination layer fractures to separate the innermost layer from the mold body as the molten metal cools.

The disclosure may be understood more readily by reference to the following detailed description of the various features of the disclosure and the examples included therein.

BRIEF DESCRIPTION OF THE DRAWINGS

Referring now to the figures wherein the like elements are numbered alike.

DETAILED DESCRIPTION OF THE INVENTION

Disclosed herein are facecoat structures for a mold employed in a directional investment casting process. The facecoat structure generally includes a graded composition that includes an innermost layer that will contact the cast metal; a sintered layer adjacent to the innermost layer; and an outer delaminating layer near or next to the main body of the mold. The innermost and sintered layers are configured to break away from the mold at the delamination layer during the solidification process, wherein the innermost and sintered layers remain bonded to the cast metal surfaces as the metal solidifies and shrinks way from the mold body. As such, the detached layers, i.e., the innermost and sintered layers, will remain in close proximity to and/or in contact with the cast metal surfaces as it cools and protect them from direct contact and reaction with any liquid metal cooling agent that infiltrates into the mold during the direction solidification process.

Figure 1:
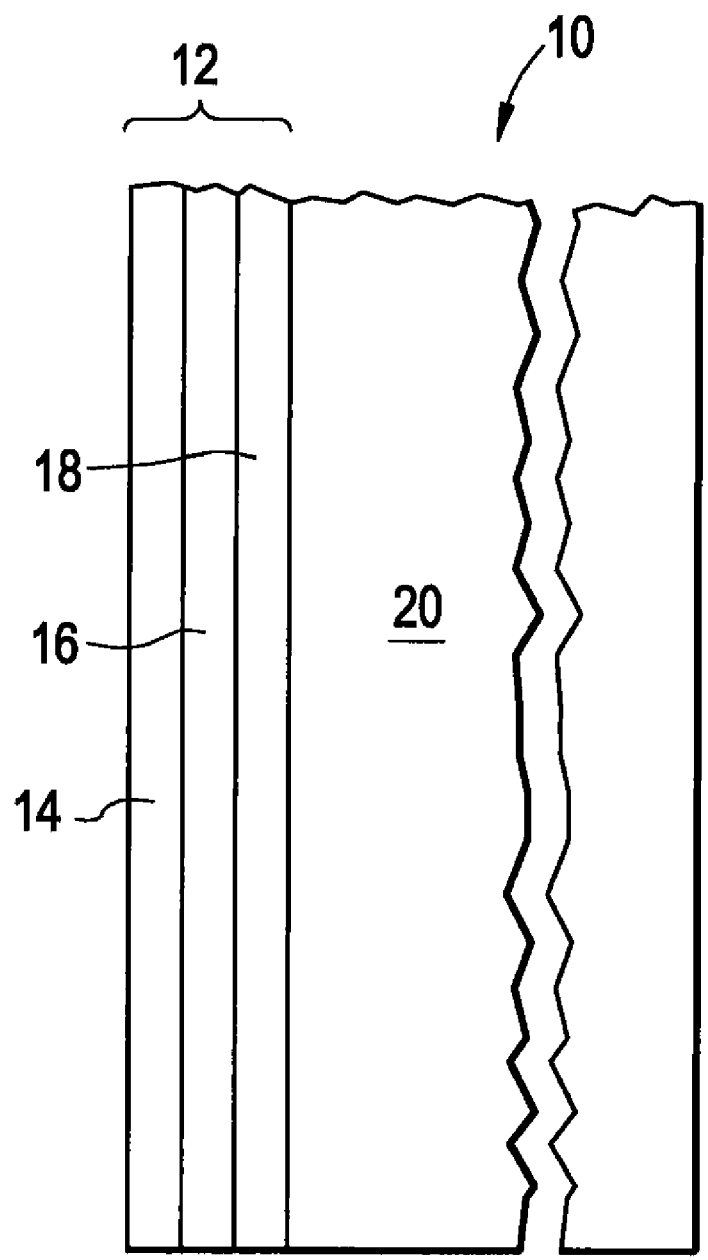
FIG. 1 illustrates a partial sectional view of a casting mold in accordance with the present disclosure.

FIG. 1 illustrates a partial cross sectional view of the mold 10. As shown and noted above, the mold includes a facecoat structure 12 that includes an innermost layer 14, a sintered layer 16, and a delamination layer 18. The mold body 20 is formed on the delamination layer and typically includes multiple ceramic layers until a desired thickness is achieved. The innermost layer 14 is positioned to directly contact the casting metal when deposited into the mold cavity.

The innermost facecoat layer 14 is generally made from ceramic materials that are relatively inert with the casting metal. In addition, as will be discussed in greater detail below, the innermost layer is configured to remain in contact with the cast metal even as shrinkage occurs. This remnant facecoat material attached on the surface of the cast metal serves to physically separate the cast metal from attack by the liquid cooling media. The innermost layer can be formed from a slurry of materials that include a binder and a refractory metal or metal oxide such as, but not limited to, alumina, calcia, silica, zirconia, zircon, yttria, titania, yttria washed alumina, physical mixtures thereof, and chemical mixtures thereof (i.e., reaction products of these materials). The binder is often a silica-based material. Colloidal silica is very popular for this purpose, and is widely used for investment-casting molds. Commercially available colloidal silica grades of this type often have a silica content of approximately 10%-50%. The slurry for this layer as well as the other layers that form the mold can be formed by mixing the refractory metal/metal oxide and binder with a liquid such as water. The innermost facecoat slurry can be applied on the surface of the mold wax pattern by dip or spray coating. Additional innermost facecoat slurry can also be applied by "washing" the inside surfaces of a mold with the slurry after it has been made.

The choice of the innermost facecoat material depends, to a large degree, on the metal being cast. As most metals are highly reactive, particularly at the elevated temperatures used during investment casting processes, it follows that the material used to produce the innermost layer is substantially non-reactive with the molten metal or alloy being cast under the conditions of the casting process. Yttria is a currently preferred facecoat material for casting articles from titanium and titanium alloys, primarily because it is less reactive with molten titanium and titanium alloys than most other mold-forming materials. On the other hand, some degree of reaction with the cast metal surface is desirable in order for the innermost facecoat material to be attached to the metal surfaces while the cast metal shrinks away from the rest of the mold after solidification. The selection of the innermost facecoat chemistry thus needs to consider generating an adequate degree of facecoat-metal reaction, which is not too severe to produce unacceptably reacted metal surfaces but sufficient for the facecoat material to be attached to the cast surfaces. In this regard, for example, yttria tends to react with nickel-base superalloys modestly and is a preferred ingredient for making the innermost facecoat for investment casting of superalloys.

Another consideration for selecting the chemistry for the innermost facecoat slurry is to include a second oxide ingredient that can react with the first ingredient as discussed above. The intra-facecoat reaction is desirable to bond the particles within the innermost facecoat layer together, so that a whole layer of the innermost facecoat material can be attached to the cast metal surfaces, rather than just the individual facecoat particles in direct contact with the metal surfaces. In this regard, alumina or silica particles or combination thereof are preferred candidates for this second ingredient for the innermost facecoat slurry. This second ingredient should be added in relatively small quantities sufficient to produce the desirable inter-particle bonding, but not enough to hinder the reaction between the cast metal and the first ingredient.

The overall thickness of the innermost facecoat layer 14, which can be formed as a single layer or as multiple layers, is about 5 microns to about 500 microns, or more preferably, about 10 microns to about 150 microns. The innermost facecoat layer should have relatively fine particle sizes of about 1 micron to about 100 microns, or more preferably, from 2 microns to about 50 microns.

The sintered layer 16 is continuous and dense with inter-particle crevices filled by a sintering mechanism during the mold preheat and solidification process. The sintered layer serves to provide a tight barrier to ingress of liquid cooling agent and prevent direct contact with the cast metal. The sintered layer can be formed of a binder and a refractory metal and/or metal oxide similar to those described above. For example, the composition can include yttria, alumina and silica. However, the sintered layer is preferably fabricated from a slurry that has a different mix of the ingredients than that of the innermost facecoat layer 14. Generally, the sintered layer slurry should contain a higher concentration of the secondary ingredient than that of the innermost facecoat slurry. The higher secondary ingredient content will produce a higher degree of inter-particle reaction and thus a denser layer facecoat structure that can provide a tight seal to any further ingress of the cooling media to attack the cast metal. The preferred secondary ingredient to increase in the sintered layer is silica, which is known to be able to react with yttria and alumina to form a low-melting product that can fill the interstices of the facecoat particles during the casting process.

It should be noted that the function of the sintered layer 16 is similar to that of the innermost facecoat layer 14 in that they both provide physical barrier to protect the cast metal from being contacted and reacted by any ingress of the cooling metal media. With the formation of a dense sintered facecoat layer structure, it provides a more ensuring protection of the cast metal in addition to the generally more porous innermost facecoat layer. In situations where the innermost facecoat layer is relatively thick, continuously uniform, and dense, a sintered layer may not be necessary to achieve desirable protection of the cast metal. In this sense, a separate sintered facecoat layer is optional, not critical in the graded facecoat structure as taught in this invention.

The overall thickness of the sintered layer, which can be formed as a single layer or as multiple layers, is about 0 to about 200 microns, or more preferably, about 10 microns to 50 microns. The refractory materials have an average diameter of about 1 micron to about 100 microns, or more preferably, about 2 microns to about 50 microns.

The delamination layer 18 is formed of a binder and refractory materials. In one embodiment, the delamination layer is porous; the amount of which is effective to break away from the main body of the mold upon cooling (i.e., shrinkage) of the casting metal. The layer formed by stucco particles between slurry layers generally has a high concentration of porosity. Facecoat delamination can thus occur within or next to the facecoat stucco layer. A delamination layer can also be induced within the facecoat region if a more porous region can be produced. Depending on the nature of the metal-facecoat reaction on the one side and the facecoat-stucco reaction on the other side, the binding element of the facecoat chemistry can be depleted inside of the facecoat layer. This complex interaction among metal, facecoat, and stucco can lead to the formation of a porous layer within the facecoat region. The reaction-induced porous layers within the facecoat region generally result from local depletion of silica during the facecoat reaction.

It is important to note that, depending on the formation mechanism, the delamination layer 18 can form between the innermost facecoat layer 14 and the sintered layer 16, or outside of the sintered layer as shown in FIG. 1. Disregarding the specific location of the delamination layer 18, both the innermost layer 14 and the sintered layer 16, if formed according to the present teaching, are able to provide protection for the cast metal. In general, however, it is preferred that the delamination layer 18 is situated outside of the sintered layer 16, so that both the innermost facecoat layer 14 and the sintered facecoat layer 16 can be detached from the rest of the mold to part with the cast metal during shrinkage.

The pores provide the layer with a porosity of 10 to 40% in one embodiment, and 30 to 60% in other embodiments. The particle sizes of the refractory materials are about 1 microns to about 100 microns in one example, and about 10 microns to about 150 microns in another example. An exemplary delamination layer composition includes zircon, silica, yttria and alumina particles. The overall thickness of the delamination layer, which can be formed as a single layer or as multiple layers, is about 1 micron to about 100 microns in one example, and about 10 microns to 500 microns in other examples.

The mold body 20 can be formed of multiple layers and is not intended to be limited to any particular material or materials. For directional solidification of superalloys, the mold material is typically selected from a binder and a refractory material comprising quartz, fused silica, calcia, zircon, zirconia, alumina, aluminosilicate, and yttria washed alumina, tungsten, yttria, titania and combinations thereof.

Typically the process for forming the mold with the graded facecoat structure as described above includes dipping a wax pattern (patterns made from other polymers also can be used) into a slurry composition or spray coating that will define the particular layer composition so as to coat the pattern with a layer of slurry. The innermost layer for contacting the molten metal or alloy to be cast is first formed and then stuccoed while wet with relatively coarse ceramic particulates (stucco). The stucco layer can be applied using a fluidized bed by spray coating, or by rain coating. Suitable rain coating devices are commercially available form Pacific Kiln & Insulations Co., Inc. The sintered and delamination layers may then be sequentially formed by repeating the sequence of dipping the pattern in the desired slurry composition, draining excess slurry, and stuccoing the requisite number of times corresponding to the number of layers desired. In one embodiment, each slurry/stucco layer is dried prior to carrying out the next coating and stuccoing operation. In other embodiments, a slurry coating is allowed to dry without stuccoing prior to applying the next slurry coating. The elimination of certain stucco steps can be an effective way to create the desirable graded facecoat structure as taught by the present invention.

The materials useful as stucco materials are substantially the same as those materials currently considered useful as mold-forming materials, i.e., alumina, calcia, silica, zirconia, zircon, yttria, physical mixtures thereof, and chemical mixtures thereof. A primary difference between mold-forming materials and stuccos is particle size, i.e., stuccos generally have larger particle sizes than other mold-forming materials such as the refractory metal/metal oxides that form the slurry. A range of particle sizes for facecoat stucco materials generally is from about 10 microns to about 200 microns. The backup layers that constitute the outer body of the mold generally include stuccos having a particle size of from about 20 microns to about 250 microns. Stuccos, as well as other mold refractory materials, can be formed as intimate mixtures with other stucco materials for practicing the present invention.

Once the facecoat structure is solidified about the pattern, additional layers, such as from about 2 to about 25 additional layers, typically from about 5 to about 20 additional layers, and more typically from about 10 to about 15 additional layers, are applied to the pattern to form the mold body 20. After thorough drying, the wax model is eliminated from the shell mold, and the mold is fired. Sometimes, before the shell has cooled from this high temperature heating, the shell is filled with molten metal. Alternately, the mold is cooled to room temperature, and is stored for later use. Subsequent re-heating of the mold will be controlled so as not to cause cracking. Various methods have been used to introduce molten metal into shells including gravity, pressure, vacuum and centrifugal methods. When the molten metal in the casting mold has solidified and cooled sufficiently, the casting may be removed from the shell.

Figure 2:
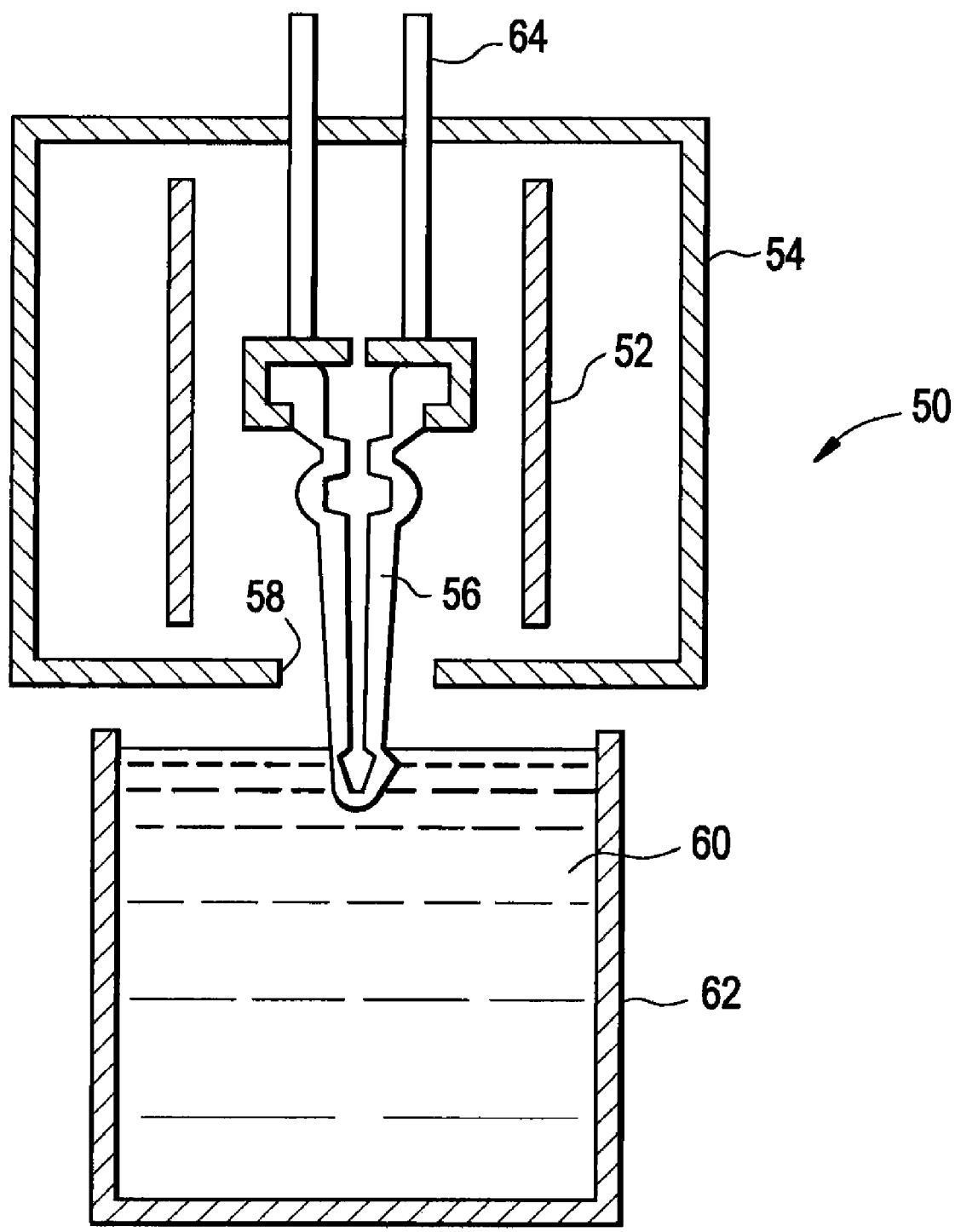
FIG. 2 depicts an exemplary embodiment of a furnace that can be used to cast molten materials via directional solidification processes

FIG. 2 depicts an exemplary embodiment of a furnace 50 that can be used to cast molten materials via directional solidification processes. As shown, the furnace 50 can include resistance heated conductive strips 52 (e.g., graphite strips) disposed within an insulated furnace box 54 for preheating the box 54. The conductive strips can be replaced by an induction coil in an alternative embodiment. A mold positioner 64 can hold a ceramic mold 56 having an inner surface coated with a metal oxide slurry within the furnace box 54. An interior of the mold 56 can be filled with a molten material that is kept in the molten state by heating the furnace box 54 at a temperature above the melting point of the molten material. Directional solidification can be achieved by lowering the mold 56 containing the molten material out of the heated furnace box 54 (i.e., the hot zone) into a liquid cooling bath 60 (i.e., the cold zone) through an aperture 58 in the furnace box 54. The cooling bath 60 can act as a cooling medium for the molten material. The cooling bath 60 can be contained in a crucible 62 of metal such as a refractory metal that is heated to a temperature below the melting point of the molten material and above the melting point of the liquid cooling medium. Solidification of the molten material can progress from bottom to top within mold 56 as the mold 56 is lowered into the cooling bath 60. In particular, a solid-liquid interface can advance upward as heat is transferred from the molten material within the mold 56 to the liquid cooling bath 60.

A satisfactory liquid cooling agent for the cooling bath of a directional solidification furnace should have a melting point significantly below that of the casting metal alloy and a high thermal conductivity. The cooling agent should be chemically inert and have a low vapor pressure. Suitable metals include metals with melting points less than 700° C. Metals with melting points less than 700° C. include, without limitation, lithium (186° C.), sodium (98° C.), magnesium (650° C.), aluminum (660° C.), potassium (63° C.), zinc (419° C.), gallium (30° C.), selenium (220° C.), rubidium (39° C.), cadmium (320° C.), indium (156° C.), tin (232° C.), antimony (630° C.), tellurium (450° C.), cesium (28° C.), mercury (−39° C.), thallium (300° C.), lead (327° C.), bismuth (276° C.), and various combinations thereof.

If any of the liquid cooling agents, e.g., a liquid metal, infiltrates through the main mold body 20 during the solidification process, the graded ceramic facecoat can inhibit the liquid cooling medium from contacting the surface of the molten material within the mold. By way of example, this infiltration of the liquid cooling medium can occur if the mold does not seal properly or if the mold cracks prematurely before the completion of the solidification process. The presence of the graded facecoat adjacent to the surface of the molten material can prevent or delay cross-diffusion between components of the liquid cooling medium and the molten material and any surface reactions between the two materials. As a result, the composition of the molten material desirably remains substantially the same and does not become contaminated during the solidification process.

In operation, the furnace box 54 is preheated to a sufficiently high temperature to insure that alloy in shell mold 56 is melted. Mold 56 is then lowered by means of mold positioner 64 into the liquid metal coolant 60 at a prescribed rate. A solid-liquid interface advances upward as heat is conducted from the alloy within the shell mold 56 and is carried away by the cooling metal. A casted part with columnar and single crystal growth structure is fully formed after the alloy is sufficiently cooled by immersion into the cooling bath 60. The part can then be easily removed from the shell mold 56.

Examples of materials that can be cast as described above include but are not limited to metals, metal alloys, superalloys, and combinations comprising at least one of the foregoing materials. As used herein, the term "superalloy" refers to a nickel (Ni), cobalt (Co), or iron (Fe) based heat resistant alloy that has superior strength and oxidation resistance at high temperatures. Superalloys can also include a metal such as chromium (Cr) to impart surface stability and one or more minor constituent such as molybdenum (Mo), tungsten (W), niobium (Nb), titanium (Ti), and/or aluminum (Al) for strengthening purposes. The physical properties of superalloys make them particularly useful for the manufacture of gas turbine components.

As used herein, the terms "a" and "an" do not denote a limitation of quantity, but rather denote the presence of at least one of the referenced items. Moreover, the endpoints of all ranges directed to the same component or property are inclusive of the endpoint and independently combinable (e.g., "about 5 wt % to about 20 wt %," is inclusive of the endpoints and all intermediate values of the ranges of "about 5 wt % to about 20 wt %,"). Reference throughout the specification to "one embodiment", "another embodiment", "an embodiment", and so forth means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments. It is also to be understood that the disclosure is not limited by any theories described therein. Unless defined otherwise, technical and scientific terms used herein have the same meaning as is commonly understood by one of skill in the art to which this invention belongs.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A mold for a directional solidification of a molten casting metal by a liquid cooling agent, the mold comprising:
a graded facecoat structure comprising
an innermost layer, a sintered layer in contact with the innermost layer, and a delamination layer in contact with the sintered layer, wherein the innermost layer comprises at least one of zirconia, zircon, yttria, titania, yttria washed alumina, or mixtures thereof, wherein
the delamination layer has a porosity of 10 to 60 percent to enable the delamination layer to fracture upon cooling of the mold.

2. The mold of claim 1, wherein the delamination layer has a thickness of about 1 micron to about 100 microns.

3. The mold of claim 1, wherein the delamination layer has a thickness of about 10 microns to about 500 microns.

4. The mold of claim 1, wherein the mold comprises a sintered layer between the innermost layer and the delamination layer wherein the innermost layer has a thickness of about 5 microns to about 500 microns, the delamination layer has a thickness of about 1 micron to about 500 microns, and the sintered layer has a thickness of about 0 to about 200 microns.

5. The mold of claim 1, wherein the innermost layer is configured to remain in contact with the casting metal as shrinkage occurs.

6. The mold of claim 1, wherein the delamination layer is comprised of at least one of zircon, silica, yttria, yttria washed alumina or mixtures thereof.

7. The mold of claim 1, wherein the delamination layer is comprised of yttria.

8. A mold for directional solidification of a casting metal according to claim 1 comprising
a sintered layer between the innermost layer and the delamination layer and comprising a mold body
wherein the innermost layer and the sintered layer adhere to or remain in close proximity to the casting metal and wherein
the delamination layer fractures upon cooling and directional solidification of the casting metal, and wherein
the mold body separates from the innermost layer and the sintered layer proximate the delamination layer.

9. The mold of claim 8, wherein the sintered layer comprises a refractory metal and/or metal oxide having an average particle size of about 1 to about 100 microns.

10. The mold of claim 8, wherein the delamination layer has a thickness of about 10 to about 500 microns.

11. The mold of claim 8, wherein the delamination layer has a thickness of about 1 micron to about 100 microns.

12. The mold of claim 8 wherein each of the innermost layer and delamination layers contains a binder.

13. The mold of claim 8, wherein the casting metal comprises metals, metal alloys, superalloys, and combinations thereof.

14. The mold of claim 8, wherein the sintering layer is configured to sinter during a mold preheat and solidification process.

15. A directional solidification casting process comprising:
casting a molten metal into a mold according to claim 1;
lowering the mold into a liquid cooling bath comprising a liquid cooling agent heated to a temperature below the melting point of the molten metal and above the melting point of the liquid cooling bath whereby
heat is transferred from the mold to the liquid cooling bath to enable directional solidification of the molten metal as the mold is lowered into the liquid cooling bath,
wherein the delamination layer fractures to separate the innermost layer from the mold body as the molten metal cools.

16. The directional solidification process of claim 15 wherein the delamination layer has a thickness of about 1 micron to about 100 microns.

17. The directional solidification process of claim 15, wherein the innermost layer contacts the molten metal as the molten metal cools in the mold in the liquid cooling bath.

18. The directional solidification process of claim 15, wherein the liquid cooling agent comprises a metal having a melting point less than 700° C.

19. The directional solidification process of claim 15, wherein the molten metal comprises metals, metal alloys, superalloys and mixtures thereof.

20. The mold of claim 1, wherein the delamination layer is comprised of at least one of zircon, silica, yttria or mixtures thereof.

* * * * *